(12) United States Patent
Biber et al.

(10) Patent No.: US 9,817,089 B2
(45) Date of Patent: Nov. 14, 2017

(54) MRI ANTENNA COIL SELECTION UNIT WITHIN PATIENT TABLE CABLE DUCT

(71) Applicants: Stephan Biber, Erlangen/Frauenaurach (DE); Jan Bollenbeck, Eggolsheim (DE); Ralph Oppelt, Uttenreuth (DE); Georg Rauh, Zirndorf (DE); Wilfried Schnell, Forchheim (DE); Markus Vester, Nuremberg (DE)

(72) Inventors: Stephan Biber, Erlangen/Frauenaurach (DE); Jan Bollenbeck, Eggolsheim (DE); Ralph Oppelt, Uttenreuth (DE); Georg Rauh, Zirndorf (DE); Wilfried Schnell, Forchheim (DE); Markus Vester, Nuremberg (DE)

(73) Assignee: Siemens Aktiengesellschaft, München (DE)

( * ) Notice: Subject to any disclaimer, the term of this patent is extended or adjusted under 35 U.S.C. 154(b) by 585 days.

(21) Appl. No.: 13/722,606

(22) Filed: Dec. 20, 2012

(65) Prior Publication Data
US 2013/0162253 A1 Jun. 27, 2013

(30) Foreign Application Priority Data
Dec. 21, 2011 (DE) .......................... 10 2011 089 376

(51) Int. Cl.
*G01R 33/30* (2006.01)
*G01R 33/3415* (2006.01)
(Continued)

(52) U.S. Cl.
CPC ......... *G01R 33/30* (2013.01); *G01R 33/3664* (2013.01); *G01R 33/3415* (2013.01); *G01R 33/56383* (2013.01)

(58) Field of Classification Search
USPC .......................... 324/300–322; 600/407–435
See application file for complete search history.

(56) References Cited

U.S. PATENT DOCUMENTS 6,452,374 B1 9/2002 Kreischer ..................... 324/309
6,529,004 B1 * 3/2003 Young ........................... 324/318
(Continued)

FOREIGN PATENT DOCUMENTS

DE 19928428 A1 1/2001
DE 102004022559 A1 * 12/2005
(Continued)

OTHER PUBLICATIONS

German Office Action dated Aug. 23, 2012 for corresponding German Patent Application No. DE 10 2011 089 376.8 with English translation.
(Continued)

*Primary Examiner* — Melissa Koval
*Assistant Examiner* — Tiffany Fetzner
(74) *Attorney, Agent, or Firm* — Lempia Summerfield Katz LLC

(57) ABSTRACT

A selection unit for a magnetic resonance imaging system may be provided. The selection unit electrically connects a first number of electrical terminals to a second number of communication entities. The selection unit is arranged in and/or on a mobile object-support element for moving an examination object which is to be depicted by the magnetic resonance imaging system into a recording position.

23 Claims, 7 Drawing Sheets

(51) Int. Cl.
*G01R 33/36* (2006.01)
*G01R 33/563* (2006.01)

(56) References Cited

U.S. PATENT DOCUMENTS

| | | | |
|---|---|---|---|
| 6,998,842 B2* | 2/2006 | Sinnema et al. | 324/318 |
| 7,141,976 B2* | 11/2006 | Campagna | 324/318 |
| 7,161,353 B2* | 1/2007 | Schaaf et al. | 324/318 |
| 7,397,245 B2* | 7/2008 | Wohlfarth | 324/318 |
| 7,602,186 B2* | 10/2009 | Hoogeveen | 324/318 |
| 7,684,427 B2 | 3/2010 | Kroeckel | 324/318 |
| 7,714,582 B2* | 5/2010 | Hagen et al. | 324/322 |
| 7,719,271 B2* | 5/2010 | Ohsawa | G01R 33/34007 324/307 |
| 7,834,628 B2 | 11/2010 | Biber et al. | 370/438 |
| 7,876,097 B2 | 1/2011 | Greim | 324/318 |
| 7,924,007 B2* | 4/2011 | Arnold et al. | 324/309 |
| 8,049,504 B2* | 11/2011 | Findeklee | 324/322 |
| 8,055,196 B2 | 11/2011 | Biber et al. | 455/41.2 |
| 8,467,846 B2* | 6/2013 | Rezzonico | A61B 5/0555 324/300 |
| 8,648,597 B2* | 2/2014 | Habara et al. | 324/318 |
| 8,901,928 B2* | 12/2014 | Alexiuk et al. | 324/318 |
| 2005/0033152 A1* | 2/2005 | Sinnema et al. | 600/410 |
| 2005/0253584 A1* | 11/2005 | Campagna | 324/318 |
| 2006/0103386 A1* | 5/2006 | Buchwald | 324/322 |
| 2008/0045830 A1* | 2/2008 | Rezzonico | A61B 5/0555 324/318 |
| 2008/0106262 A1* | 5/2008 | Ohsawa | G01R 33/34007 324/318 |
| 2008/0150535 A1* | 6/2008 | Hoogeveen | 324/322 |
| 2008/0211502 A1* | 9/2008 | Arnold et al. | 324/318 |
| 2009/0076377 A1* | 3/2009 | Findekelee | 600/422 |
| 2009/0140739 A1* | 6/2009 | Bennett | 324/318 |
| 2010/0253347 A1* | 10/2010 | Habara et al. | 324/318 |
| 2010/0315085 A1 | 12/2010 | Brown et al. | 324/73.1 |
| 2012/0112747 A1* | 5/2012 | Alexiuk et al. | 324/318 |
| 2013/0162253 A1* | 6/2013 | Biber et al. | 324/318 |

FOREIGN PATENT DOCUMENTS

| | | |
|---|---|---|
| DE | 10 2004 055 939 A1 | 5/2006 |
| DE | 102004022559 B4 * | 5/2006 |
| DE | 10 2007 047 021 A1 | 4/2009 |
| DE | 10 2007 053 429 A1 | 5/2009 |
| DE | 10 2008 023 467 A1 | 12/2009 |

OTHER PUBLICATIONS

Chinese Office action for related Chinese Application No. 201210560024.3, dated Dec. 2, 2015, with English Translation.

* cited by examiner

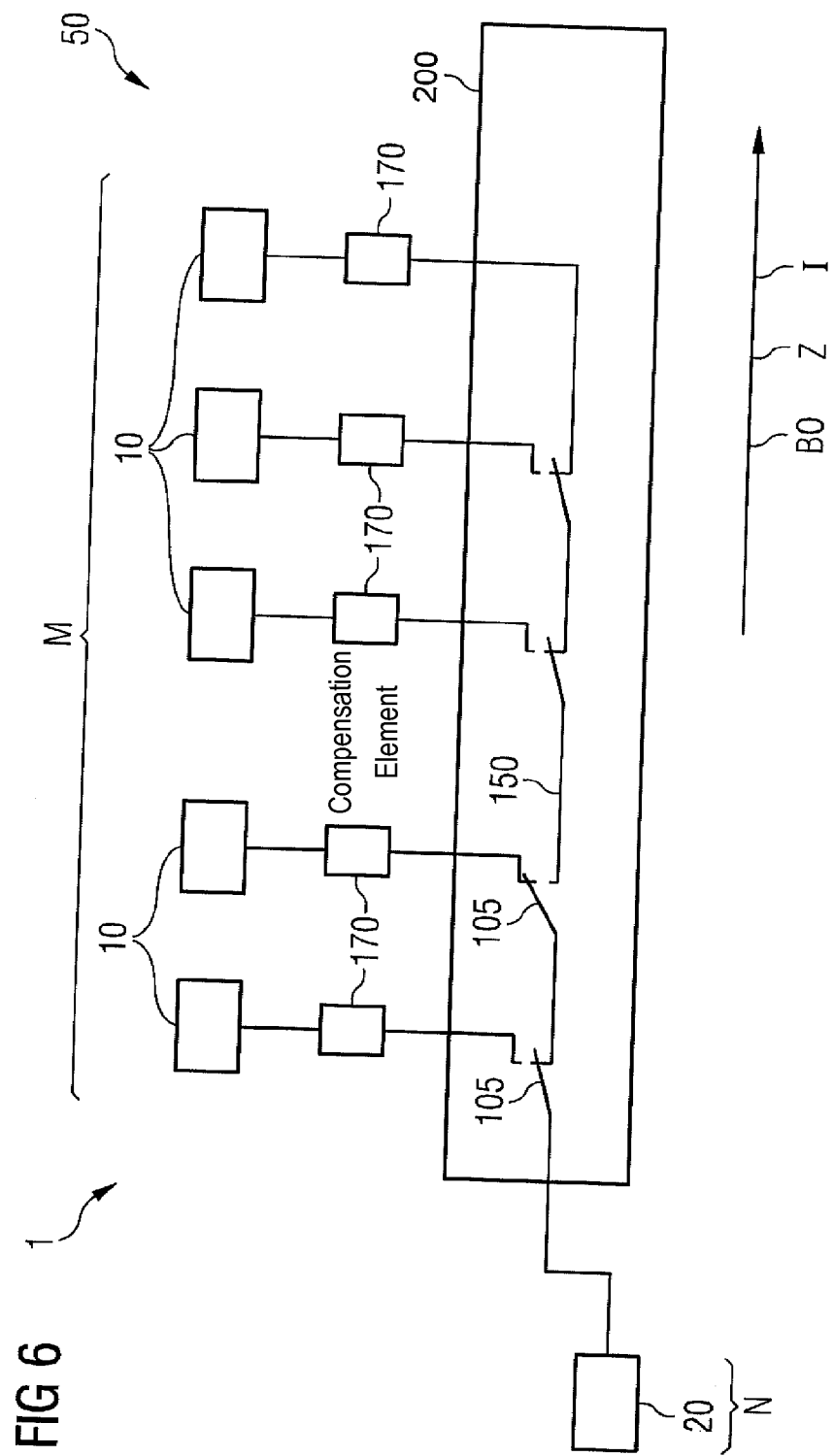

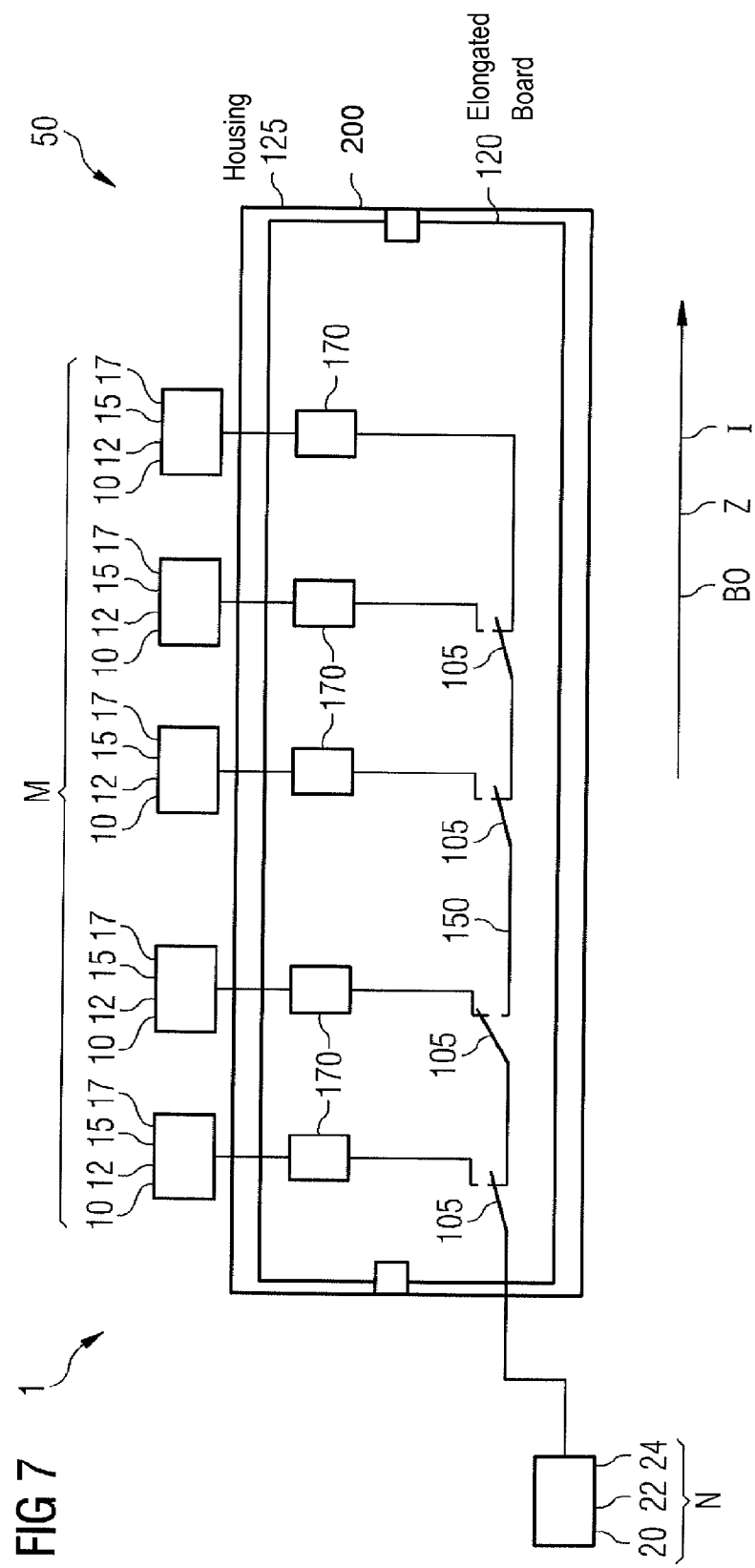

MRI ANTENNA COIL SELECTION UNIT WITHIN PATIENT TABLE CABLE DUCT

This application claims the benefit of German Patent Application No. DE 10 2010 089 376.8, filed Dec. 21, 2011.

BACKGROUND

The present embodiments relate to a selection unit for a magnetic resonance imaging (MRI) system. The selection unit connects a first number of electrical terminals to a second number of communication entities.

For substantial magnetic resonance recordings, e.g. when large or voluminous examination objects are to be depicted, it is rarely possible to complete the imaging in a single step. This may be attributable to a limited volume that can be penetrated by a homogenous magnetic field when using the magnetic resonance system.

Consequently, the magnetic resonance recording is effected in a plurality of steps. In such a case, a multiplicity of local antenna elements are usually used for a magnetic resonance signal and are already arranged before starting the first magnetic resonance recording of the examination object that is to be depicted, such that a complete image can be produced in a plurality of steps without any unnecessary delay to the imaging. However, during the image capture, only those antenna elements that are arranged within the limited volume are involved in the imaging for the respective step of the magnetic resonance recording, and a mobile support element for the examination object is moved in a plurality of steps, or passed through so-called stages, in the limited volume for imaging.

A magnetic resonance imaging system normally only has a limited number of receive points or receive channels (the number may be influenced by the limited volume of the respective imaging system) that may be connected to the local antenna elements and in which signals that are received from the antenna elements undergo further processing and are prepared for a reconstruction of image data. Therefore, the number of local antenna elements often exceeds the number of receive points.

In order to allow rapid connection of the local antenna elements to the receive points of the magnetic resonance imaging system, a selection unit that allows a change in the assignment of local antenna elements to receive points of the imaging system may be used.

The selection unit is usually arranged on a stationary part of the magnetic resonance imaging system, such that a multiplicity of connection cables need to be routed, via a flexible cable duct, from the local antenna elements to the selection unit.

This frequently has an adverse effect on the signal that is transmitted to the imaging system from the local antenna elements, such that a connection of sufficient quality, i.e., a connection in which the image quality is not significantly affected, may only be established by applying particular care in a method that is very difficult to perform.

This problem is not, however, restricted to the local antenna elements as electrical terminals.

SUMMARY AND DESCRIPTION

The present embodiments may obviate one or more of the drawbacks or limitations in the related art. For example, a selection unit that improves the connection of electrical terminals (e.g., antenna elements or their components) in a magnetic resonance imaging system that includes communication entities (e.g., receive points or receive channels), and thereby achieves a consistent image quality or an improved image quality may be provided.

In one embodiment, a selection unit for a magnetic resonance imaging system is provided to electrically connect a first number of electrical terminals to a second number of communication entities. The selection unit may be arranged in and/or on a mobile object-support element for moving an examination object into a recording position.

As used herein, examination object refers to an examination object that is to be depicted using the magnetic resonance imaging system.

Adaptations to the electrical connection(s) due to, for example, a different arrangement of the electrical terminals, may therefore be easily effected, since, for example, an electrical length may be defined or specified for each of the electrical terminals. Moreover, the number of flexibly routed connection elements between the electrical terminals and the communication entities may also be reduced.

In one embodiment, a method for electrically connecting a first number of electrical terminals to a second number of communication entities using a selection unit is provided. The selection unit is arranged in and/or on a mobile object-support element for moving an examination object into a recording position.

In one embodiment, the electrical terminals are arranged in a fixed manner relative to the mobile support element for the examination object during the magnetic resonance recording (i.e., the electrical terminals are moved or repositioned with the mobile support element for the examination object).

In one embodiment, the first number of electrical terminals is different from (e.g., exceeds) the second number of communication entities.

In this arrangement, the selection device may also be referred to as an M×N switch matrix, which has a number of M first connections or connection lines and a number of N second connections or connection lines, the number N being lower or less than the number M.

Accordingly, the number of required connection lines or conductors may be reduced from the number M to the number N. The proportion of the flexibly routed line sections may, in turn, be reduced.

As mentioned above, the electrical terminals may include an antenna element for each magnetic resonance signal. The antenna element may be a transmit coil or a receive coil of the magnetic resonance system, and may represent a local receive coil. In addition, the combination of an antenna element and a preamplifier may also be considered as an electrical terminal. Electrical terminals may also include analog-digital converters and/or modulators and transmitters. The analog-digital converters and/or modulators and transmitters may be combined with the antenna element, in which case the electrical terminals may, for example, further include devices that are combined with the antenna element as a module or are directly assigned to the antenna element.

Better communication of HF signals in the magnetic resonance imaging system makes a significant contribution to the improvement of the image quality. This is particularly important with regard to, for example, the communication of HF signals from antenna elements to corresponding communication entities. Therefore, the image quality may be significantly improved by connecting antenna elements via the selection unit.

The communication entities may include receivers for a magnetic resonance signal, preferably featuring one or more receive channels, in which the signals that are received from the antenna elements undergo further processing and are prepared for a reconstruction of image data. The receivers, which may include amplifiers, reproduce, in multiplied form, any interference in the signal that is transferred, and therefore any improvement in the signal path from, for example, antenna elements by virtue of the selection unit may again result in improved image quality.

The amplifiers or preamplifiers may be configured to offer a wide bandwidth of linear communication. For example, amplifiers or preamplifiers which have a linear bandwidth in the kHz to MHz range and may be combined effectively with the selection unit may be used.

In addition, the electrical terminals may include a tuning element for tuning an antenna element for a magnetic resonance signal. For signal communication via antenna elements, the tuning element may be used to detune antenna elements that are intended for receiving in order to allow undisrupted interaction of the transmit signal with the examination object. In addition, the tuning elements may also be used to tune antenna elements to a specific frequency for receiving magnetic resonance signals. A tuning element may therefore activate or deactivate one or more antenna elements.

The number of antenna elements may be the same as the number of tuning elements for the corresponding antenna elements. The problem of improving the connection therefore also concerns the tuning elements, and therefore a significant reduction in the number and/or length of the connection elements or conductors that are used for the connection may be achieved using or via the selection unit.

Accordingly, in one embodiment, the communication entities may include a trigger device for a tuning element for tuning an antenna element for a magnetic resonance signal.

The selection unit for connecting a first number of electrical terminals to a second number of communication entities in a magnetic resonance imaging system may be designed or constructed as a bus device or bus-like device. As such, the selection unit may be arranged on a mobile object-support element. Irrespective of the fact that the selection unit is arranged in and/or on a mobile object-support element for moving an examination object into a recording position, such an implementation of the selection unit may also be advantageous because it allows a drastic reduction in the number of connection cables.

A bus-like connection or bus-like device may be understood to mean an arrangement or combination of one or more independent conductors that can be connected to the communication entities, as is also provided by, for example, a bus system in electronic computer systems. The one or more conductors may each include one or more switch elements that establish or interrupt the connection between the communication entities and the electrical terminals, thereby providing a selection from a plurality of electrical terminals. Each connection of one of the electrical terminals to one of the communication entities is effected via one of the independent conductors by or using the switch elements.

In a bus device, the respective independent and connected conductor that is used for connecting one of the electrical terminals to one of the communication entities remains uninterrupted in a switch position of the switch element. The independent conductor therefore provides a non-interrupted or uninterrupted line section, which may be connected to one or more of the electrical terminals. The switch elements establish an exclusive connection to this uninterrupted line section. As such, an electrical signal always propagates over all switch elements of the respective independent and connected conductor.

In a bus-like device, one of the switch elements interrupts the respective conductor for the purpose of connecting to one of the electrical terminals. Moreover, the switch elements are so arranged that, in a switch state of the switch element in which an electrical terminal is not connected to a communication entity via the respective conductor, the line connection continues to an adjacent switch element that is connected to the same conductor. This arrangement is also known as, for example, a 'bypass' circuit. An individual conductor may therefore be considered as a chain of connected switch elements, wherein when establishing a connection between a communication entity and an electrical terminal using or via one of the switch elements, the chain is interrupted in order to establish the connection.

Relative to a bus system or bus device, this interruption is considered a difference which can be used to improve the signal quality of the connection.

A bus-like device may also create a connection between a communication entity and an electrical terminal, which is effected via all switch elements of the chain of connected switch elements, and, therefore, no interruption in the aforementioned chain is required to establish the connection via all switch elements.

In one embodiment, the selection unit may be designed or constructed as a combination of bus-like device and bus device, which may also be referred to as bus-like arrangement and bus arrangement.

By virtue of the bus-like design of the selection unit, and/or its design as a bus arrangement, it is possible to drastically reduce the number of conductors or connection elements that are used for the purpose of connecting the electrical terminals to the communication entities, and, in particular, to limit the proportion of the flexible line routing.

In one embodiment, the conductors of the bus-like device or bus device may include or feature a termination, such that electrical reflection signals within the bus arrangement or bus-like arrangement may be avoided.

In one embodiment, the selection unit includes a control element which connects the electrical terminals to the communication entities as a function of the position of the mobile object-support element in the magnetic resonance imaging system.

Therefore, a connection or separation (or also an activation or deactivation) of the electrical terminals may be or is defined by the movement of the mobile object-support element in the magnetic resonance imaging system. This is particularly advantageous when applied to the antenna elements and/or the tuning elements. For example, an antenna element may therefore be activated or connected to a corresponding receiver as a function of the section that is currently to be captured in the examination object that is being depicted, for example, or as a function of the step of the magnetic resonance image recording. Likewise, this applies to a tuning element for tuning or detuning corresponding antenna elements.

The aforementioned activation or deactivation may be achieved automatically. For example, the control element may be actuated mechanically, optically or electrically (e.g., pneumatically or electrostatically). This can be achieved by or using, for example, register elements that divide the movement of the mobile object-support element into individual sections and trigger the control element accordingly. In one embodiment, the register elements may be arranged so as to adjoin the mobile object-support element.

However, in another embodiment, the selection unit may also be configured to receive a control signal of a control unit for controlling the movement of the mobile object-support element. The control signal indicates the position of the mobile object-support element in the magnetic resonance system. In this embodiment, the connection of the electrical terminals to the communication entities is based on or a function of the control signal.

It would then be possible to omit the aforementioned register elements, which control a position-dependent connection or separation of electrical terminals.

In one embodiment, the selection unit essentially matches the measurements of the mobile object-support element in at least one dimension, or differs by a specific amount in at least one dimension from the measurements of the support element for the examination object.

As used herein, 'essentially matches the measurements' refers to the fact that the selection unit may be enclosed (e.g. clamped) in the object-support element in this dimension, and the specific amount in the at least one dimension may correspond to 25% of the measurements of the mobile support for the examination object. The dimension may be defined by the direction of the largest extent of the mobile object-support element. The dimension may correspond to a possible direction of movement of the mobile object-support element during the operation of the magnetic resonance imaging system.

It is therefore possible, for example, to activate or deactivate the electrical terminals over the entire extent of the mobile object-support element, such that the proportion of flexible connection routing may be minimized.

In one embodiment, the selection unit may be rigid, such as a rigid single board.

Individual interfaces or connection points, with the electrical terminals or individual switch elements, may therefore be arranged over the planar extent of the board at regular or irregular intervals. Different advantages may be associated with a regular or irregular arrangement of the connection points.

For a regular arrangement of the connection points, it is possible to minimize the effort involved in adapting to requirements relating to, for example, the line of an HF signal, while for an irregular arrangement, an adaptation to the position of the electrical terminals at the examination object, in particular to the location of a local coil or the antenna element, may be improved.

In one embodiment, both regular and irregular intervals may be used. For example, regular or irregular arrangement may be used on a sectional basis.

In a magnetic resonance imaging system that features the selection unit according to one of the present embodiments, a plurality of different signals may be transferred simultaneously, at least sectionally, via a connection that is formed between the electrical terminals and the communication entities by or using the selection unit.

For example, the selection unit may therefore be designed such that HF signals (high-frequency signals) and DC signals (direct-current signals) or quasi-DC signals (which may signify the presence of a frequency interval of a plurality of decades relative to the HF signal) may be transferred simultaneously via a single connection of the selection entity. For this purpose, a single interface of the selection unit or entity may be designed for the attachment of a plurality of electrical terminals or communication entities.

In one embodiment, simultaneous transfer of HF and DC or quasi-DC signals may be effected by or using the interface unit for signals of the antenna elements and the tuning elements. Consequently, for example, the tuning or active detuning may be restricted to antenna elements that are involved in the measurement.

Those antenna elements that are not involved in the measurement may be statically detuned using an identical potential or control signal. This may be effected using, for example, the 'bypass' circuit. In one embodiment, the control signal may also be provided or influenced by the trigger device.

BRIEF DESCRIPTION OF THE DRAWINGS

FIG. 6 shows one embodiment of a selection unit that is connected to compensation elements; and FIG. 7 shows one embodiment of a selection unit in which the selection unit is a board and essentially matches the measurements of the object-support element in at least one dimension.

DETAILED DESCRIPTION OF THE DRAWINGS

Figure 1:
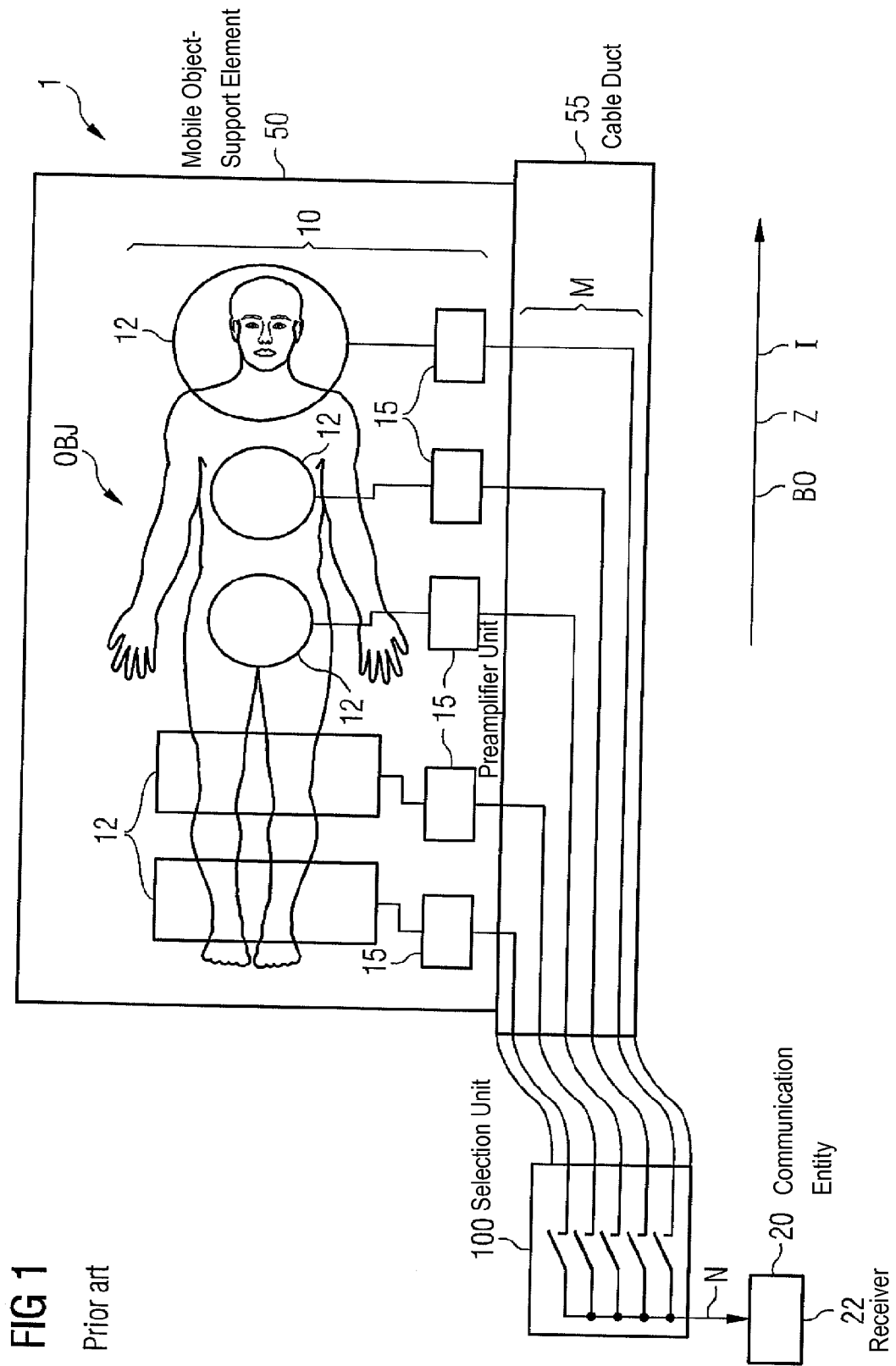
FIG. 1 shows a prior art magnetic resonance imaging system.

FIG. 1 illustrates part of a magnetic resonance imaging system 1. FIG. 1 illustrates the mobile section of a couch or of a repositionable table, which provides a mobile object-support element 50 of the magnetic resonance imaging system. A cable duct 55 featuring a fixed section and a flexible section is connected to or integrated in the couch.

Arranged in these sections are connection lines or connections from antenna elements 12 (e.g., local coils) or preamplifiers 15 assigned to the antenna elements 12 to receivers 22 or receive channels of the magnetic resonance imaging system. The two aforementioned sections of the aforementioned cable duct therefore carry the same number of connection lines. The antenna elements 12 or preamplifier units 15 are therefore electrical terminals 10 and the receivers 22 represent communication entities 20.

The connection is effected by or using a selection unit 100, which is described in greater detail below and is located separately from the couch, connected to the couch by means of the flexible section of the cable duct.

The image capture takes place in the magnetic resonance imaging system 1 using a powerful basic magnet. A basic magnetic field B0 is provided for aligning nuclear spin-induced magnetic dipole moments. The magnetic field is homogeneously formed in a limited volume V or spatial region only and is oriented in a spatial direction z.

If the size of the examination object OBJ to be examined is greater than this limited volume V, this also being referred to as the 'isocenter' of the magnetic resonance imaging system 1, a complete recording of the examination object OBJ may consist of a plurality of partial pictures that are recorded in so-called stages.

To this end, the examination object OBJ that is to be depicted is moved progressively into or out of the limited volume V by means of the couch, which supports the examination object OBJ during the magnetic resonance recording.

A main direction of movement I of the couch typically corresponds to the orientation of the basic magnetic field B0 in spatial direction z. The main direction of movement I designates the direction in which the couch has the greatest range of motion.

In order to optimize the image capture sequence and increase the capture speed of the overall recording, a multiplicity of antenna elements 12 may be arranged in a distributed manner over the surface, such as over the whole surface or between the couch and the object of the examination object OBJ before the recording sequence is started. In one embodiment, all local receive coils that are required for measuring all steps or stages of the complete recording are arranged in a distributed manner over the surface of the examination object OBJ that is to be depicted, or connected thereto, before the recording sequence is started.

However, only those antenna elements 12 which are arranged in the spatial region of the respective stage or in the limited volume V may contribute to the recording of the respective magnetic resonance partial images that are used to produce the complete recording of the examination object OBJ.

From the multiplicity of antenna elements 12, it is therefore necessary at each measurement time-point or at each position of the patient couch to identify a selection to be connected to the magnetic resonance imaging system 1 for the purpose of magnetic resonance recording.

Selection units 100 for this purpose are known, as illustrated in FIG. 1. Known selection units 100 are arranged in a fixed manner in or on the magnetic resonance imaging system 1 (i.e., the units are connected to, for example, a housing of the magnetic resonance imaging system within which the table or the couch is moved). The selection units are connected to the multiplicity of antenna elements 12 or to preamplifiers 15 that are assigned to the antenna elements, and are designed to perform a selection or assignment of the antenna elements 12 to receivers 22 of the magnetic resonance imaging system 1.

As mentioned previously, the connection of the multiplicity of antenna elements 12 to the selection unit 100 is effected by or using conductors which are arranged in a cable duct 55 that is connected to the couch. In order to compensate for the motional range of the table, which is necessary for the complete recording of the examination object OBJ, a certain section of the conductors, corresponding at least to the motional range, is, as previously mentioned, routed in a flexible manner to the selection unit 100.

Only by applying extreme care in the arrangement and selection of the conductors is it possible to prevent a reduction of the signal quality in this section. This requires a considerable effort in the operation of the magnetic resonance imaging system 1, and often involves a difficult compensation method for improving the signal quality.

The effort that is required to operate the MRI system 1 may be significantly reduced by or using a selection unit 200 spaced from the magnetic resonance imaging system 1.

In one embodiment, the selection unit 200 for electrically connecting a first number M of electrical terminals 10 to a second number N of communication entities 20 in the MRI system 1 is provided. The selection unit 200 is arranged in or on a mobile object-support element 50 for moving an examination object OBJ, which is to be depicted by or using the MRI system 1, into a recording position.

The arrangement on the mobile object-support element 50 may reduce the number or length of the flexibly routed line sections to communication entities 20 or provide a defined but easily adjustable electrical length in an effort to improve the quality and manageability of the connection.

The selection unit 200, as described herein, may also be used in a method for connecting electrical terminals 10 to communication entities 20.

In contrast with the selection unit 100 shown in FIG. 1, the selection unit 200 is arranged on or in the mobile object-support element 50 (e.g., the table or patient couch which can be repositioned in a z direction). In one embodiment, one of the electrical terminals 10 includes an antenna element 12 (e.g., a local receive coil), and an assigned preamplifier unit 15.

As a result, it is possible to drastically reduce the number and length of the flexibly routed line sections, as will be described below. It should be emphasized that the flexibly routed section of the cable duct has to carry a significantly smaller number of connections, corresponding in this exemplary embodiment to the number of receivers 22, such that a flexible section of the cable duct 55 may, if the flexible connection is designed as a single coaxial cable, be omitted.

Figure 2:
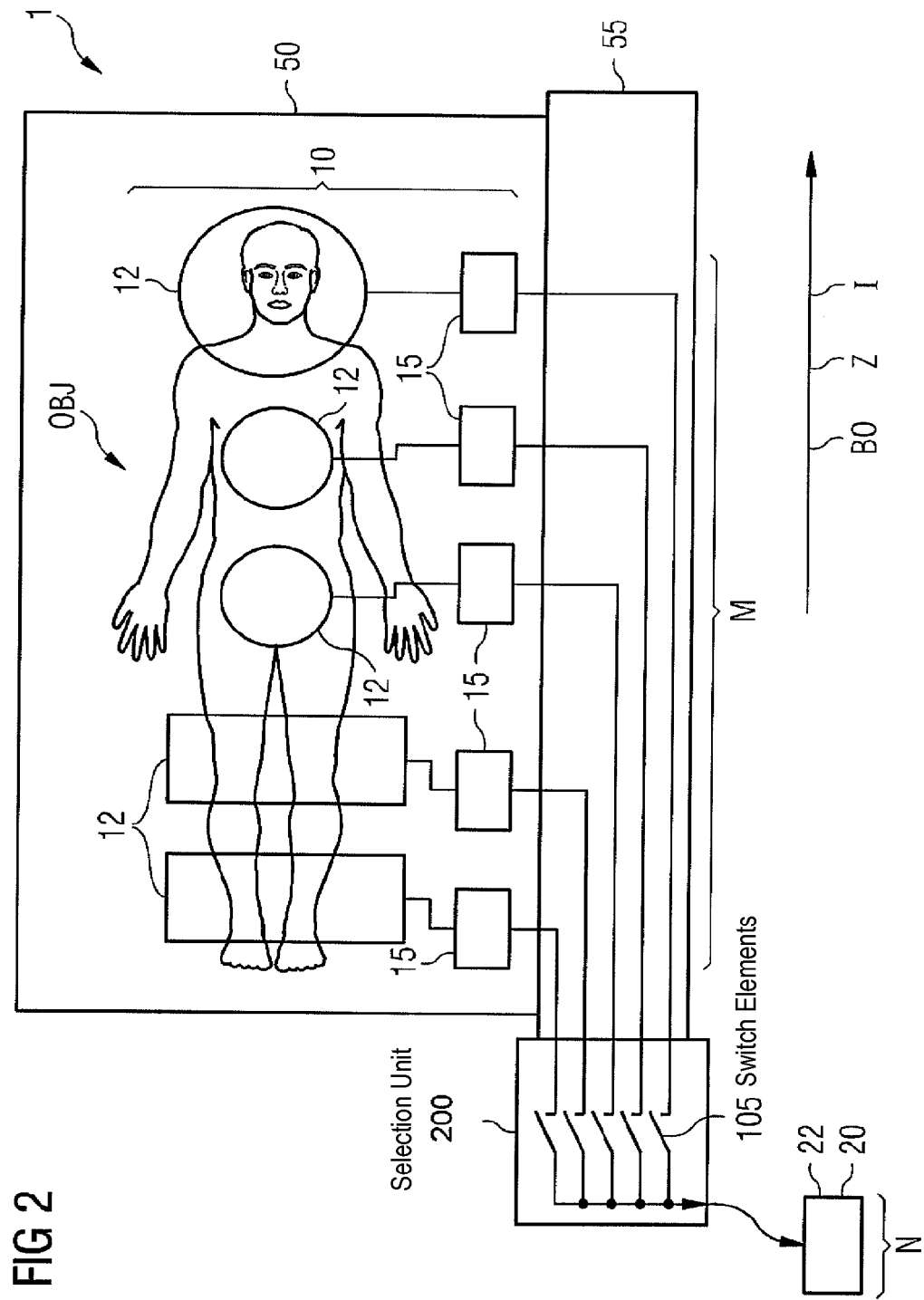
FIG. 2 shows one embodiment of a magnetic resonance imaging system.
Figure 3:
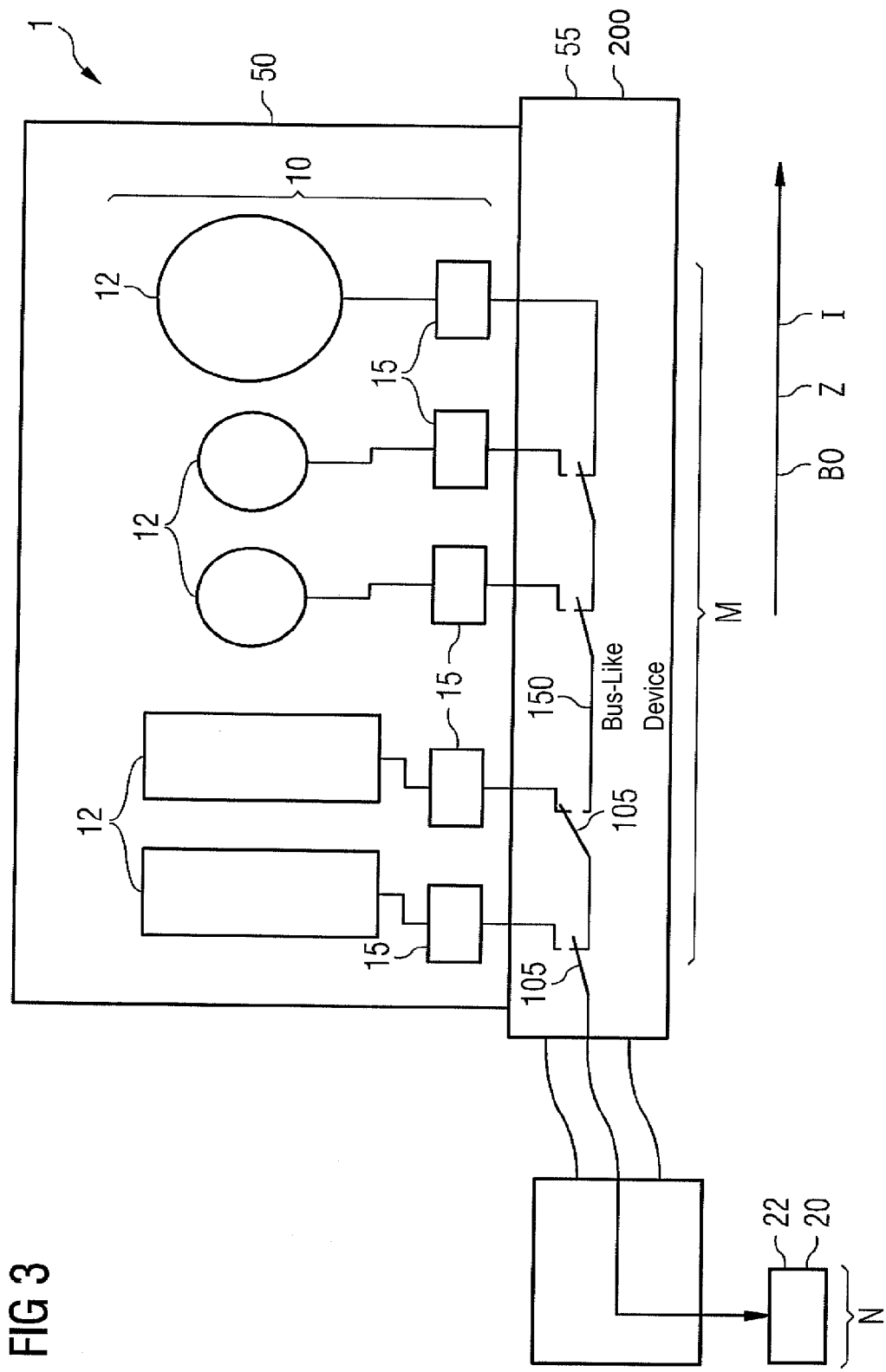
FIG. 3 shows one embodiment of a selection unit that is arranged in a mobile support object of the magnetic resonance imaging system of FIG. 2.

The exemplary embodiment shown in FIG. 3 includes improvements over the exemplary embodiment shown in FIG. 2.

A section of the mobile object-support element 50 is embodied, in this embodiment, as a cable duct 55 which matches or even exceeds the total length of the table or couch that is illustrated here. This dimension corresponds, in this exemplary embodiment, to the main direction of movement I of the couch in the magnetic resonance imaging system 1, or to the aforementioned direction z.

In this exemplary embodiment, the cable duct 55 forms a housing 125 of the selection unit 200, though in other embodiments it need not do so. As shown previously in FIG. 2, any arrangement in or on the mobile object-support element 50 or the couch is may be employed.

However, the exemplary embodiment described above offers the possibility of arranging antenna elements 12 over the entire extent, in the described dimension, of the examination object OBJ that is to be depicted, and connecting them to the selection unit 200 via a short path. In one embodiment, the selection unit 200 in the main direction of movement I matches at least the measurements of the motional range of the mobile couch in this direction, as will become clear in the following example.

By way of example, the first number M of antenna elements 12 or preamplifiers 15 is five. The first number M of antenna elements 12 is essentially defined by the size of the examination object OBJ that is to be depicted, but may be defined in another way and/or may vary in other embodiments.

In order to improve the illustration, the number N of receivers 22 is one in the exemplary embodiment. In other embodiments, however, a higher second number N of receivers 22 or communication entities 20 that may be connected to the antenna elements 12 or electrical terminals 10 by or using the interface unit 200 may be used.

In the exemplary embodiment, the length and/or the number of flexible portions of the connection may, advantageously, be decreased if the first number M is greater than the second number N. The number of the flexibly routed line sections from the antenna elements 12 to the receivers 22 may be reduced from the first number M to the second number N.

Switch elements 105 are arranged in the cable duct 55 or in or on the mobile object-support element 50, and allow the electrical terminals 10 to be connected to the communication entities 20 at certain times, or allow a selection of the connections between electrical terminals 10 and communication units 20.

In the exemplary embodiment, the switch elements 105 form part of a previously mentioned bus-like connection of electrical terminals 10 to the communication entities 20, such that the selection unit 200 forms or includes a bus-like device 150.

By or using the switch elements 105, a bus-like conductor arrangement or bus-like device 150 that connects each antenna element 12 to one of the receivers 22 may be defined, thereby forming one or more so-called 'point-to-point' connections.

The bus-like device 150 includes a plurality of switch units 105 that are linked together serially in a chain-like arrangement for selection. In an initial switch setting of the switch elements 105, one of the receivers 22 assigned to the chain is connected to one of the antenna elements 12 via all switch elements 105 of the chain or serial connection. When it is desired to change an assignment or selection of antenna elements 12 relative to a receiver 22 that is assigned to the chain, the change is effected by interrupting the chain and connecting the receiver 22 to the desired other antenna element 12 or the local receive coil by changing the switch position of one of the switch elements 105. Any switch elements 105 that are located behind the aforementioned switch element 105 in the chain are not, at least in this example, connected to one of the receivers 22. The initial serial connection of all of the switch elements 105 in a chain is therefore interrupted by a changed connection between a receiver 22 that is assigned to the chain and assigned to one of the antenna elements 12.

As described in previous exemplary embodiments, the electrical terminals 10 in this exemplary embodiment include, for example, five local receive coils and preamplifier units 15 assigned to each of the local receive coils. The preamplifier units 15 are not identified as separate devices and may also form an integrated module. A single line length including a chain of serially connected switch elements 105 allows a selection to be made from these five local receive coils in this embodiment.

In this embodiment, the switch elements 105 of the chain are connected in such a way that at least one of the local receive coils is connected to the receiver 22 at all times.

In other embodiments, the bus-like device 150 may include or feature a plurality of individual line lengths each including a chain of serially connected switch elements 105.

In the exemplary embodiment described above, the number of flexibly routed line sections is again drastically reduced, while at the same time the signal quality may be significantly improved due to, for example, a decrease in crosstalk.

Figure 4:
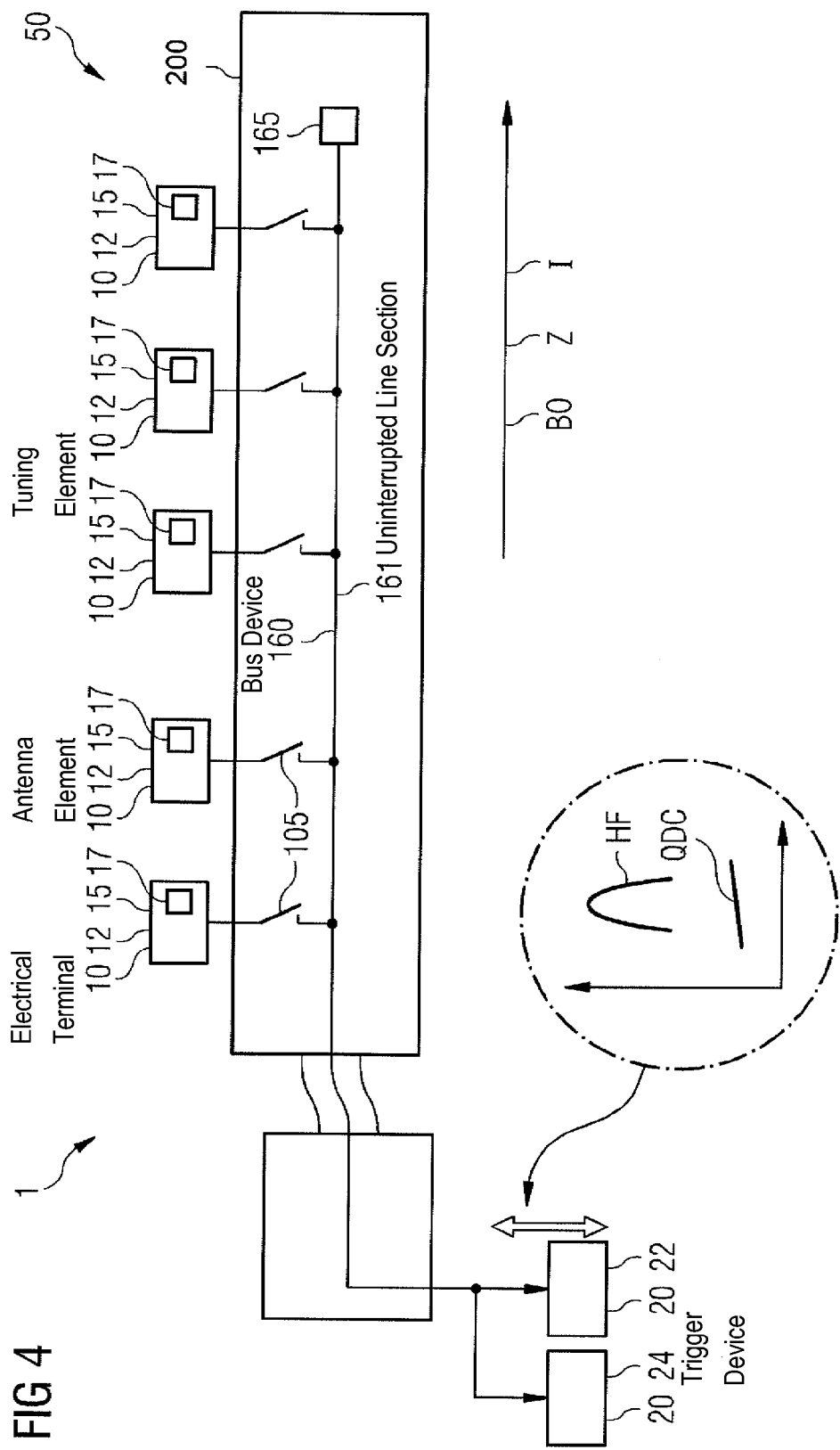
FIG. 4 shows one embodiment of a selection unit in which the selection unit is designed as a bus arrangement.

In contrast with the exemplary embodiment in FIG. 3, FIG. 4 shows the design of a selection unit 200 as a bus structure or bus device 160. In this embodiment, at least one conductor may provide a continuous line section 161 that is not uninterrupted and may be connected to each of the one or more of the local receive coils or preamplifier units 15 by or using the switch elements 105. In addition, the conductor is connected or may be connected to one of the receivers 22. In this embodiment, the electrical terminals 10, in particular the outputs of the preamplifier unit 15, are connected in the form of a high-resistance current source to the bus device 160 by or via the switch elements 105.

The different location and arrangement of the coupling points or connection points of the electrical terminals 10 or local receive coils relative to the bus device 160, in particular relative to the uninterrupted line section 161, may result in a different effect on the transmitted signal for each connection point or each electrical terminal due to, for example, the different signal propagation time or signal reflections.

In order to improve the connection quality, a non-reflective attenuator or terminator 165 is, in this embodiment, connected to the uninterrupted line section 161 or bus device 160. This causes an arriving signal to be absorbed and thereby prevents a signal reflection, particularly for the transmission of high-frequency signals HF, as in the case of, for example, the illustrated antenna elements 12, particularly the local transmit coils or local receive coils. This may be achieved, for example, by or using a resistor element that is adapted to the line resistance of the bus device 160. In such a case, it may be particularly advantageous if the bus device 160 or the selection entity 100 includes a plurality of uninterrupted line sections 161 having an identical line resistance.

In addition, further adaptations for improving the connection quality may be employed or utilized.

In contrast with the exemplary embodiment in FIG. 3, which shows a bus-like device 150, in the bus device 160 illustrated in FIG. 4, each of the desired electrical terminals 10 is connected to the respective communication entities, but each of the undesired electrical terminals 10 is disconnected from the bus structure or bus device 160.

Figure 5:
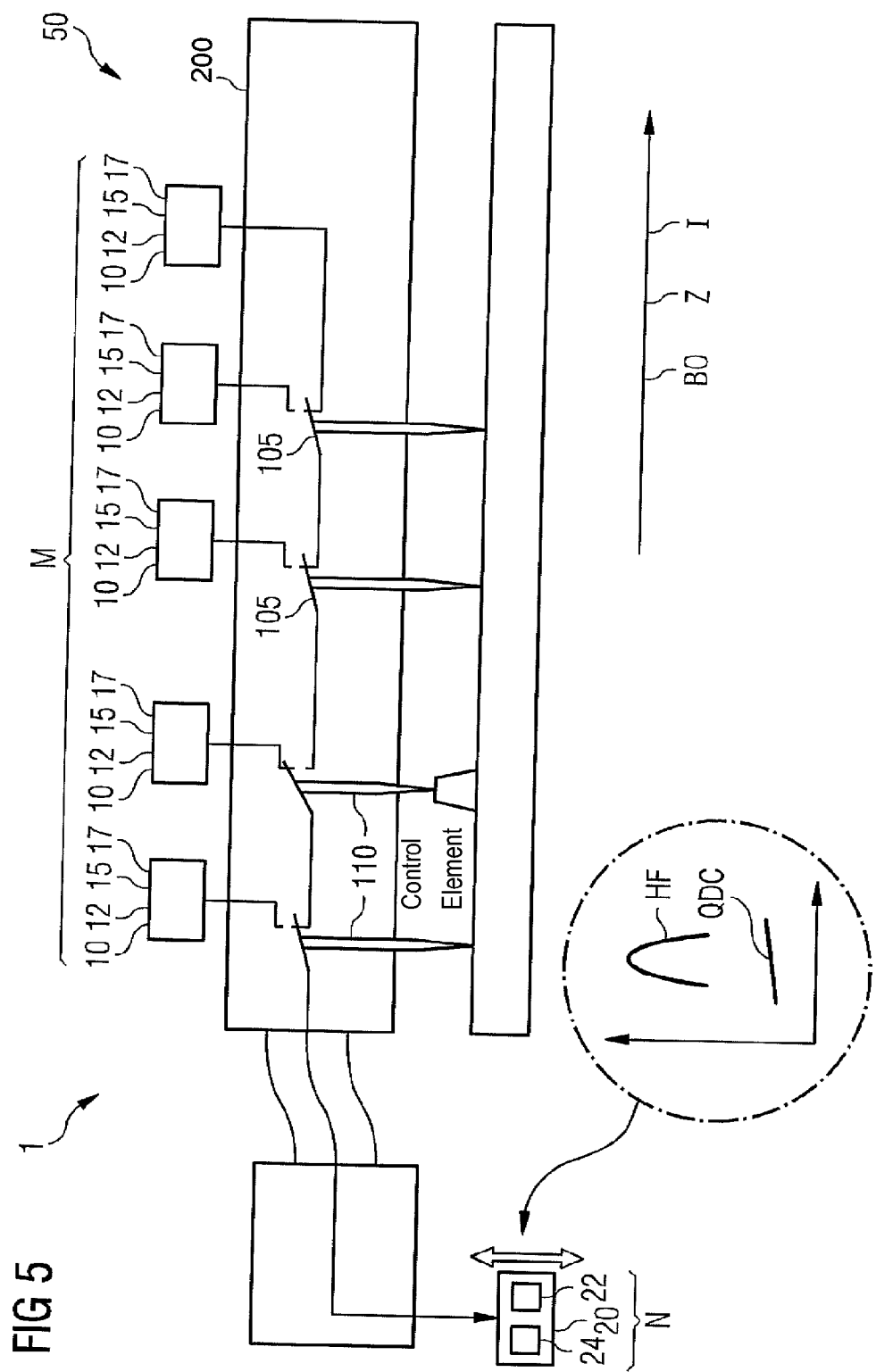
FIG. 5 shows one embodiment of a selection unit that provides a position-controlled connection of electrical terminals.

As shown in the exemplary embodiment depicted by FIG. 5, the electrical terminals 10 may be automatically connected and disconnected via the selection unit 200 when the selection unit 200 includes neither a bus device 160 nor a bus-like device 150.

For this purpose, the selection unit 200 includes a control element 110, which connects the electrical terminals 10 to the communication entities 20 as a function of the position of the mobile object-support element 50 or couch in the magnetic resonance imaging system 1. In this embodiment, the electrical terminals 10 include local receive coils with corresponding preamplifiers 15 and the communication entities 20 include receivers 22.

In this embodiment, actuating elements (e.g., operating pins) that actuate each one of the switch elements 105 may be provided. The mobile object-support element 50 or mobile repositionable table is moved in the main direction of movement I past a cam strip that engages with the operating pins. By virtue of the arrangement of the cams, it is thus possible to achieve a position-dependent encoding of the position of the switch elements 105, such that the local receive coils are connected to receivers 22 as a function of the position of the mobile object-support element 50 in the magnetic resonance imaging system 1.

In some embodiments, a bus-like device 150 is provided in the selection unit 200. Actuating elements of the switch units 105, e.g. the operating pins, are arranged in at least one row in the main direction of movement I of the couch. By virtue of the bus-like device, a local receive coil may automatically be connected to one of the receivers 22 in a 'point-to-point' connection by or via a single operating cam. However, the described type of mechanical actuation of the switch elements 150 may also be applied to a bus device 160 or other embodiments of the selection unit 200.

In addition to mechanically triggering the switch elements 105 for the purpose of automatic disconnection and connection, the position-dependent encoding of the triggering of the switch elements 105 may, in other embodiments, be achieved by actuating elements of a different design.

The actuation of the switch elements 105 may be effected individually or in combination, such as mechanically, optically, or electrically (e.g., pneumatically or electrostatically). An associated control element 110 may evaluate a register element or capture the position of the object-support element 50 optically or electrically, for example. The register element may divide the movement of the mobile object-support element 50 into a plurality of sections. This may be mechanically realized via or using, for example, the cams or cam strip described above. The register element may provide position information that is mechanically, optically, or electrically encoded. The switch elements 105 may also be activated pneumatically or electrostatically using, for example, MEMS switches. However, the position of the mobile object-support element 50 in the magnetic resonance imaging system 1 need not be captured by or via a register element. In other embodiments, the position may be directly measured via the control element 110 using mechanical, optical, or electrical (e.g., electrostatic) elements or components.

In addition to optically, mechanically, or electrically capturing the position of the mobile object-support element 50 by or via the control elements 110, the control elements 110 may instead be configured to receive a control signal of a control unit for the position of the mobile object-support element 50 or couch in the magnetic resonance imaging system 1. In such an embodiment, the control signal may indicate the position of the mobile object-support element 50 or couch in the magnetic resonance imaging system 1. Accordingly, the present embodiments provide for a control signal that may be modified such that the control element may derive a position of the mobile object-support element 50 in the magnetic resonance imaging system. For example, the position of the couch may be derived by or via the control element from a step motor signal that controls the movement of the couch. The control unit may also be configured to realize a modification of the control signal.

As mentioned above, the communication entities 20 or electrical terminals 10 are not limited solely to receivers 22 for a magnetic resonance signal or antenna elements 12 with preamplifiers 15. As indicated in FIGS. 4 and 5, the selection unit 200 in the magnetic resonance imaging system 1 may be provided for the purpose of transferring a multiplicity of different signals, allowing various combinations of electrical terminals 10 and communication entities 20.

For example, the selection unit 200 may include a plurality of bus devices 160 or bus-like devices 150 for transferring signals of different communication entities 20 or different electrical terminals 10. The different signals may include a high-frequency signal HF (e.g. in the frequency range between 10 MHz and 600 MHz) and/or a quasi-DC signal QDC, such as, for example, a quasi-DC signal that has switching edges of less than 5 V/µs and a maximal switching rate of 1 kHz and therefore corresponds to a typical pin diode switching signal.

The selection unit 200 may include a corresponding bus device 160 or a bus-like device 150 for each of these signals HF, QDC. However, in other embodiments, the signals HF, QDC in the magnetic resonance imaging system 1 may be transferred concurrently via identical bus devices 160 or bus-like devices 150. In the embodiment depicted in FIG. 5, a bidirectional connection line (indicated by a dual-headed arrow) may be provided into which a plurality of signals HF and QDC (illustrated symbolically in a circle) are input.

In the embodiment depicted in FIG. 5, as in the embodiment depicted in FIG. 4, the communication entities 20 include a receiver 22 for a magnetic resonance signal (e.g., a high-frequency signal HF), and a trigger device 24 for a tuning element 17 for tuning an antenna element 12 for a magnetic resonance signal. The trigger device 24 transmits a quasi DC signal QDC. In contrast with the embodiment depicted in FIG. 4, the receiver 22 and trigger device 24 are combined into one module in the embodiment depicted in FIG. 5.

The trigger device 24 may be the PIN diode trigger device for detuning receive coils. As well as being transferred via separate bus devices 160 or bus-like devices 150, the signals may be transferred via identical bus devices 160 or bus-like devices 150 in the magnetic resonance imaging system 1. For this purpose, a chain of switch elements 105 of a bus-like device 150 may be connected (e.g., concurrently) to a plurality of different communication entities 20 or receivers 22 and trigger devices 24.

In other embodiments, the continuous uninterrupted line section 161 of the bus device 160 may be connected to a plurality of different communication entities 20, which include, for example, receivers 22 and trigger devices 24.

In other embodiments, a different switching sequence of the switch elements 105 may be used for different electrical terminals 10 (e.g., a tuning element 17 for tuning an antenna element 12 for a magnetic resonance signal and an antenna element 12 or preamplifier 15). When, for example, bus devices 160 are utilized, switch elements 105 that allow a connection to an antenna element may differ from switch elements 105 that allow a connection to a tuning element 17. The control elements may then actuate these switch elements 105, as appropriate, such that some receive coils are, for example, connected and tuned at the same time, while other receive coils are detuned.

In the present embodiments, however, the switching sequence of the switch elements 105, which may be dependent on the position of the couch in the magnetic resonance imaging system 1, is identical for the different electrical terminals 10. Therefore, depending on the position of the couch in the magnetic resonance imaging system 1, antenna elements 12 may be automatically and concurrently connected to associated receivers 22, and the antenna elements 12 may automatically be tuned. For example, both a tuning element 17 and a receive coil may be connected to each one of the receivers 22 or one of the trigger devices 24 via the same switch element 105.

With reference again to FIG. 5, by way of example, in a bus-like device 150, only those tuning elements 17 that are connected to trigger devices 24 may receive a dynamic 'detuning signal' for the detuning of receive coils, while tuning elements 17 that are not connected to trigger devices 24 effect a static detuning of the receive coils. Though not shown in FIG. 5, a connection to a predefined static potential may be provided for the unconnected tuning elements 17, the predefined static potential being automatically supplied to the unconnected tuning elements 17 by or via, for example, the switch elements 105.

As explained above, the present embodiments improve the connection between electrical terminals 10 and communication entities 20. FIG. 6 depicts additional measures that may be used to further improve this connection.

In the embodiment depicted in FIG. 6, compensation elements 170 are arranged in the signal path ahead of the input of signals into the selection unit 200, and compensate for different lengths of the signal path in the selection unit 200. Different lengths, which may also be defined as, for example, electrical lengths, cause, for example, both a variation in the attenuation of the signal (due to, for example, the line resistance), and different signal propagation times. The compensation elements 170 may then be used to, for example, adapt the resistance of the transfer path or to dilate the time of the transferred signal, thereby compensating for the described effects of different lengths in the selection unit 200.

As shown in FIG. 7, the compensation elements 170 may also be arranged in or on the selection unit 200. In this embodiment, the selection unit 200 is rigid. In particular, the selection unit 200 has the shape of an elongated board 120 whose longitudinal extent projects in the main direction of movement I of the mobile object-support element 50. As indicated above, it is particularly advantageous if the selection unit 200 essentially matches the measurements of the couch in at least one dimension.

In this embodiment, the board 120, which also carries the compensation elements 170, essentially matches the measurements of the previously cited mobile repositionable table in the main direction of movement I (i.e., in the direction of longitudinal extent of the table). Only routing elements or mounting elements, which allow a clamped fastening in this direction, require the selection unit 200 to be separated from a housing 125 of the table by less than 25% of the measurements of the table or mobile object-support element 50 in the main direction of movement I.

It is therefore effectively possible to provide connection points with electrical terminals 10 over the entire length of the table or over the extent of the mobile object-support element 50 in the main direction of movement I. These connection points may be arranged at regular intervals (e.g., equally spaced intervals). This may, for example, result in a particularly simple adjustment of the compensation elements 170.

However, the connection points may, in other embodiments, be arranged in a manner that is adapted to the shape of frequently depicted examination objects OBJ. A plurality of sequences of equally distanced connection points may, for example, be provided.

It is also evident from the illustrations in FIGS. 6 and 7 that a compensation element 170 may, in turn, be assigned to each connection point, thereby allowing simple adaptation to various electrical terminals.

It is clear from the foregoing that the present embodiments effectively provide possibilities for improving the connection of electrical terminals and communication entities, which, in turn, may improve the quality of magnetic resonance imaging.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A selection unit configured for a magnetic resonance (MR) imaging system and configured to electrically connect a first number of electrical terminals to a second number of communication entities, the selection unit comprising:
   a conductor configured to connect the first number of electrical terminals to the second number of communication entities;
   one or more switch elements coupled to the conductor, each of the one or more switch elements configured to establish or interrupt connections between the second number of communication entities and the first number of electrical terminals, respectively; and
   a controller configured to control via the one or more switch elements the respective connections between the second number of communication entities and the first number of electrical terminals,
   wherein the selection unit, including the conductor, the one or more switch elements, and the controller, is arranged in a table or couch system, such that each of these selection unit components is located inside the table or couch system, with the table or couch system being spaced from the magnetic resonance imaging system, and the table or couch system being a table or couch system that moves an examination object into a recording position, when MR imaging is performed.

2. The selection unit as claimed in claim 1, wherein the first number of electrical terminals is different from the second number of communication entities.

3. The selection unit as claimed in claim 2, wherein the first number of electrical terminals is greater than the second number of communication entities.

4. The selection unit as claimed in claim 1, wherein the electrical terminals comprise an antenna element configured for a magnetic resonance signal.

5. The selection unit as claimed in claim 1, wherein the electrical terminals comprise a tuning element configured for tuning an antenna element that receives a magnetic resonance signal.

6. The selection unit as claimed in claim 3, wherein the electrical terminals comprise a tuning element configured for tuning the antenna element that receives the magnetic resonance signal.

7. The selection unit as claimed in claim 1, wherein the communication entities comprise receivers configured for a magnetic resonance signal.

8. The selection unit as claimed in claim 5, wherein the communication entities comprise receivers configured for the magnetic resonance signal.

9. The selection unit as claimed in claim 1, wherein the communication entities comprise a trigger device configured for a tuning element that is configured to tune an antenna element Worn which receives a magnetic resonance signal.

10. The selection unit as claimed in claim 4, wherein the communication entities comprise a trigger device configured for the tuning element.

11. The selection unit as claimed in claim 5, wherein the communication entities comprise a trigger device configured for the tuning element.

12. The selection unit as claimed in claim 1, wherein the selection unit is a bus device, a bus-like device, or a combination thereof.

13. The selection unit as claimed in claim 5, wherein the selection unit is a bus device, a bus-like device, or a combination thereof.

14. The selection unit as claimed in claim 11, wherein the selection unit comprises a plurality of mutually independent bus devices or bus-like devices.

15. The selection unit as claimed in claim 12, wherein the selection unit comprises a plurality of mutually independent bus devices or bus-like devices.

16. The selection unit as claimed in claim 1, wherein the controller further comprises a control element that connects the electrical terminals to the communication entities as a function of a position of a table or couch, of the table or couch system in the magnetic resonance imaging system.

17. The selection unit as claimed in claim 16, wherein the selection unit is configured to receive a control signal from a control unit for when controlling the movement of the table or couch system, wherein the control signal indicates a position of a table or couch of the table or couch system in the magnetic resonance system, and wherein the selection unit is configured to electrically connect the electrical terminals to the communication entities based on the control signal.

18. The selection unit as claimed in claim 1, wherein at least one dimension of the selection unit matches measurements of the table or couch system when moving the examination object into the recording position.

19. The selection unit as claimed in claim 1, wherein the selection unit is rigid.

20. The selection unit as claimed in claim 1, wherein the selection unit is a rigid single board.

21. A system comprising:
a magnetic resonance imaging device;
a selection unit configured for the magnetic resonance imaging device, the selection unit configured to electrically connect a first number of electrical terminals to a second number of communication entities; and
a table or couch system that moves an examination object into a recording position, within the magnetic resonance imaging device;
wherein the selection unit comprises:
a conductor configured to connect the first number of electrical terminals to the second number of communication entities;
one or more switch elements coupled to the conductor, each of the one or more switch elements configured to establish or interrupt connections between the second number of communication entities and the first number of electrical terminals, respectively; and
a controller configured to control via the one or more switch elements, the respective connections between the second number of communication entities and the first number of electrical terminals, wherein the selection unit, including the conductor, the one or more switch elements, and the controller, is arranged in the table or couch system, such that each of the selection unit components is located inside the table or couch system, with the table or couch system being spaced from the magnetic resonance imaging device.

22. The system as claimed in claim 21, wherein the selection unit is configured to simultaneously transfer a plurality of different signals between the selected electrical terminals and the selected communication entities that are electrically connected.

23. A method that connects electrical terminals to communication entities in a magnetic resonance (MR) imaging system, the method comprising:
electrically connecting the electrical terminals to the communication entities via a selection unit, the selection unit comprising:
a conductor configured to connect the electrical terminals to the communication entities;
one or more switch elements coupled to the conductor, each of the one or more switch elements configured to establish or interrupt connections between the communication entities and the electrical terminals, respectively; and
a controller configured to control via the one or more switch elements the respective connections between the communication entities and the electrical terminals; and
arranging the selection unit in a table or couch system, such that each of the selection unit components is located inside the table or couch system, with the table or couch system being spaced from the magnetic resonance imaging system, and also being a table or couch system that moves an examination object into a recording position, when performing MR imaging, with the MR imaging system.

* * * * *

UNITED STATES PATENT AND TRADEMARK OFFICE
CERTIFICATE OF CORRECTION

PATENT NO. : 9,817,089 B2  
APPLICATION NO. : 13/722606  
DATED : November 14, 2017  
INVENTOR(S) : Stephan Biber et al.

Page 1 of 1

It is certified that error appears in the above-identified patent and that said Letters Patent is hereby corrected as shown below:

In the Claims  
Column 14  
Claim 9, Line 40, "Worn" should be deleted

Signed and Sealed this  
Twenty-sixth Day of February, 2019

Andrei Iancu  
*Director of the United States Patent and Trademark Office*